United States Patent [19]

Ohashi et al.

[11] Patent Number: 5,221,355
[45] Date of Patent: Jun. 22, 1993

[54] SILICON CARBIDE FILM FORMING APPARATUS

[75] Inventors: Toshiyasu Ohashi, Annaka; Yoshihiro Kubota; Kesazi Harada, both of Takasaki; Takesi Satoh, Annaka, all of Japan

[73] Assignee: Shin-Etsu Chemical Co., Ltd., Tokyo, Japan

[21] Appl. No.: 962,282

[22] Filed: Oct. 16, 1992

[30] Foreign Application Priority Data

Oct. 31, 1991 [JP] Japan .................... 3-311348

[51] Int. Cl.$^5$ .................................... C23C 16/00
[52] U.S. Cl. .................... 118/725; 118/715; 427/237; 427/238; 427/249
[58] Field of Search ............... 118/715, 725; 427/237, 427/238, 249

[56] References Cited

U.S. PATENT DOCUMENTS 4,293,594 10/1981 Yoldas ................... 427/237

FOREIGN PATENT DOCUMENTS 60-6304 1/1985 Japan .
3-72075 3/1991 Japan .

Primary Examiner—Richard Bueker
Attorney, Agent, or Firm—McAulay Fisher Nissen Goldberg & Kiel

[57] ABSTRACT

An apparatus for forming a high purity silicon carbide film on the inner surface of a cylindrical member by a chemical vapor phase deposition process is provided. The member to be coated is received in a reaction vessel and heated by a heating means. The apparatus includes a gas feed conduit having a distal end disposed for axial motion within the member, for feeding a source gas containing a carbon source and a silicon source into the interior of the member, and a gas discharge conduit having a distal end disposed for axial motion within the member, for discharging used reaction gases from within the member. The gas feed and discharge conduits are moved so that their distal ends move through the member in unison to continuously move the reaction region.

1 Claim, 1 Drawing Sheet

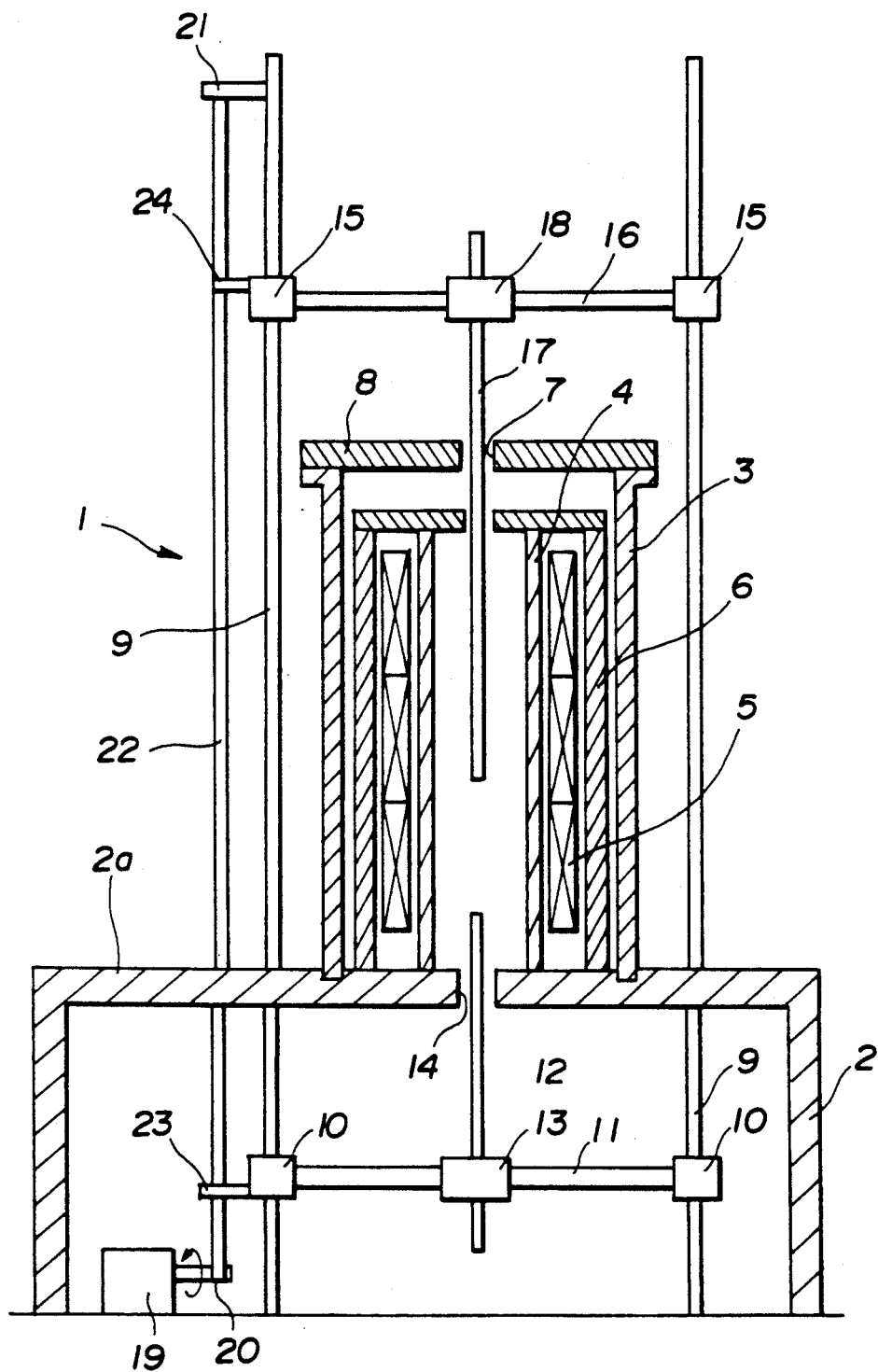

SILICON CARBIDE FILM FORMING APPARATUS

TECHNICAL FIELD

This invention relates to a silicon carbide film forming apparatus, and more particularly, to an apparatus for forming a silicon carbide film on the inner surface of a reaction tube for use as a diffusion furnace intended for semiconductor heat treatment.

BACKGROUND OF THE INVENTION

The reaction tube used as the semiconductor diffusion furnace is commonly a cylindrical silicon carbide substrate having a high purity silicon carbide film formed on the inner surface thereof. In the manufacture of the reaction tube, a high purity silicon carbide film is generally formed on the inner surface of a substrate by a chemical vapor phase deposition (CVD) process including feeding a source gas containing a carbon source and a silicon source to the hollow interior of the substrate, and heating the source gas in vacuum for depositing silicon carbide on the substrate inner surface.

The silicon carbide films deposited by the conventional process, however, are relatively poor in denseness, evenness and homogeneity and can give rise to undesirable phenomena such as failure and separation. More particularly, in forming a silicon carbide film on the inner surface of a long cylindrical substrate as required for the reaction tube adapted to construct a diffusion furnace, the source gas is supplied from one open end of the cylindrical substrate. Then a thicker film can deposit on the inner surface in the vicinity of the source gas feeding site or nearer to the one end. An axial change of reaction conditions along the cylindrical substrate can affect the denseness of the film. It is thus difficult to form a film having high denseness, evenness and homogeneity. Thus the reaction tube having an inner coating formed by such a process, when it is used as a semiconductor diffusion furnace, tends to experience a failure or separation of the coating during subsequent heat treatment of semiconductor. This is quite undesirable because the semiconductor can be contaminated by passage or diffusion of impurities originating from silicon carbide substrates.

One solution to this problem is proposed in Japanese Patent Publication No. 6304/1985. A silicon carbide film forming apparatus is disclosed therein as comprising a cylindrical outer shell, a cylindrical electrode disposed within the shell, and a silicon carbide tube disposed within the electrode. A source gas is fed to the interior of the silicon carbide tube from one end thereof while a band-shaped zone of the electrode interior is heated by a ring-shaped induction heater disposed around the shell for axial motion. By moving the induction heater along the shell, the heated zone or reaction zone is axially moved thereby preventing any change in film thickness and denseness between the one end where the source gas is fed and the other end of the tube.

Also, Japanese Patent Application Kokai No. 72075/1991 discloses a silicon carbide film forming apparatus in which silicon carbide film-forming reaction is carried out while a source gas feed conduit is axially moved through the silicon carbide tube to be coated, thereby preventing any change in thickness and denseness of the resulting film in the axial direction throughout the silicon carbide tube.

In these apparatus, however, the distance between the reaction region and a gas discharge outlet changes and it is difficult to control the temperature distribution and gas compositions (carbon source/silicon source ratio, source gas/carrier gas ratio, etc.) therebetween. Although film thickness control is relatively easy, the change of composition in thickness direction of the deposited film can substantially differ between the gas inlet and outlet.

SUMMARY OF THE INVENTION

Therefore, an object of the present invention is to provide a silicon carbide film forming apparatus capable of forming a high purity silicon carbide film featuring evenness and homogeneity over the entire inner surface of a long cylindrical member so that the apparatus is suited for the manufacture of a reaction tube of silicon carbide for use as a semiconductor diffusion furnace.

The present invention is addressed to an apparatus for forming a high purity silicon carbide film on the inner surface of a cylindrical member by a chemical vapor phase deposition process. The member to be coated is received in a reaction vessel. A heating means is provided for heating the member in the reaction vessel. A gas feed conduit having a distal end disposed for axial motion within the member serves to feed a source gas containing a carbon source and a silicon source into the interior of the member. A gas discharge conduit having a distal end disposed for axial motion within the member serves to discharge used reaction gases from within the member. Drive means is provided for moving the gas feed and discharge conduits in unison.

In the operation of the silicon carbide film forming apparatus, a silicon carbide film is formed on the inner surface of a cylindrical member to be coated by receiving the member in the reaction vessel, heating the member by the heater means, feeding a source gas to the member interior from the distal end of the gas feed conduit, and discharging used reaction gases through the distal end of the gas discharge conduit. Both the gas feed and discharge conduits are axially moved through the member whereby silicon carbide deposits over the entire inner surface of the cylindrical member in a CVD manner, resulting in a silicon carbide film.

In the silicon carbide film forming apparatus of the invention, the source gas is fed into the member to be coated from the gas feed conduit while the conduit is axially moved through the member. At the same time, unreacted gases and reaction product gases are drawn in or discharged from the gas discharge conduit while the conduit is axially moved through the member in unison with the feed conduit. This unison motion of the gas feed and discharge conduits continuously defines a constant reaction region so that a uniform homogeneous deposit is formed on the inner surface of the cylindrical member even when it is axially long. The uniform homogeneous film is substantially free of failure and separation. The resulting silicon carbide reaction tube is suited for use as a semiconductor diffusion furnace since it eliminates the possible contamination of semiconductor during heat treatment due to passage or diffusion of impurities originating from silicon carbide substrates.

BRIEF DESCRIPTION OF THE INVENTION

The foregoing aspects and other features of the invention are explained in the following description, taken in conjunction with the accompanying drawing.

BRIEF DESCRIPTION OF THE DRAWING

The only FIGURE is a schematic view of a silicon carbide film forming apparatus according to one preferred embodiment of the invention.

DESCRIPTION OF THE PREFERRED EMBODIMENT

Referring to the FIGURE, there is illustrated a silicon carbide film forming apparatus according to one preferred embodiment of the invention which is advantageously used to form a high purity silicon carbide film on the inner surface of a hollow cylindrical silicon carbide substrate intended for use as a semiconductor diffusion reaction tube. The apparatus 1 includes a platform structure 2 on a base and a cylindrical reaction tube or vessel 3 perpendicularly attached to the platform structure 2 so that the vessel 3 stands vertically upright. In the reaction vessel 3 is received a cylindrical member 4 to be coated on the inner surface by a CVD process. Also received in the reaction vessel 3 is a cylindrical graphite heater 5 which encircles the outer periphery of the member 4. In the preferred embodiment, the vessel 3, heater 5 and member 4 are generally in axial alignment as illustrated herein. A cylindrical heat insulator 6 is interposed between the heater 5 and the reaction vessel 4 inner surface. In the illustrated embodiment, the insulator 6 also forms a part of a holder for retaining the member 4 within the vessel 3. The upper open end of the vessel 3 is air-tightly closed by a cover 8 through an O ring (not shown). The cover 8 has a center hole 7 through which a gas discharge conduit 17 is inserted into the member 4 interior.

The platform structure 2 is configured as a hollow box having a platform 2a and a skirt. A pair of vertical poles 9 and 9 are fixedly secured to the base and vertically extend upward through the platform 2a on opposite sides of the vessel 3. The poles 9 are provided with first slide rings 10 for sliding motion within the platform compartment. A beam 11 extends between the slide rings 10 and 10. A gas feed conduit 12 is attached to the beam 11 at the center thereof through a fitting 13. The gas feed conduit 12 extends vertically upward into the interior of the reaction vessel 3 and member 4 through a center hole 14 in the platform 2a and terminates at a distal or upper end which is located in the member 4 interior. It is understood that the gas feed conduit 12 is coupled to a reactant gas source (not shown).

Above the platform 2a, more particularly above the cover 8, the poles 9 are provided with second slide rings 15 for sliding motion. A beam 16 extends between the slide rings 15 and 15. The gas discharge conduit 17 is attached to the beam 16 at the center thereof through a fitting 18. The gas discharge conduit 17 extends vertically downward into the interior of the reaction vessel 3 and member 4 through the center hole 7 in the cover 8 and terminates at a distal or lower end which is located in the member 4 interior. It is understood that the gas discharge conduit 17 is coupled to a suction unit, for example, a vacuum pump though not shown in the FIGURE.

Disposed within the platform structure 2 is a motor 19 with a reduction gear. A driving chain 22 is extended between a rotating shaft 20 of the motor 19 and a pin 21 attached to the upper end of one pole 9. To the chain 22 are fixedly secured tabs 23 and 24 attached to one first and second slide rings 10 and 15, respectively. Then when the chain 22 is moved vertically up or down upon actuation of the motor 19, the first and second slide rings 10, 10 and 15, 15 and beams 11 and 16 are moved vertically up or down in unison, and the gas feed and discharge conduits 12 and 17 are also moved vertically up or down in unison therewith.

Using the apparatus of the above-illustrated construction, a high purity silicon carbide film is formed on the inner surface of a cylindrical silicon carbide base substrate which is to be processed into a reaction tube useful as a semiconductor diffusion furnace. To this end, the member 4 which is a cylindrical silicon carbide base substrate is first placed in the reaction vessel 3. The cover 8 is attached to the vessel 3 for closure. The reaction vessel 3 is purged of air through the discharge conduit 17 by means of a vacuum pump, replaced by nitrogen, and then evacuated again to establish a vacuum in the vessel 3 interior. In this initial stage, the gas feed and discharge conduits 12 and 17 are at their lowest position. With the vessel 3 kept in vacuum, electricity is conducted across the heater 5 for heating and a source gas containing a carbon source and a silicon source is injected into the member 4 interior through the feed conduit 12. The motor 19 is concurrently actuated so as to slowly move upward the gas feed and discharge conduits 12 and 17 in an interlocking manner. Then gas phase synthesis and deposition takes place under the same conditions over the entire inner surface of the member 4 from its lower end to its upper end.

The source gas used herein may be a mixture of a compound containing carbon and silicon at the same time and a carrier gas or a mixture of two compounds separately containing carbon and silicon and a carrier gas. Desirably, the reaction vessel 3 interior is heated to a temperature of about 1100° to 1500° C. and maintained in a vacuum of about 1 to 100 Torr. The relative distance between the gas feed and discharge conduits 12 and 17 may be properly determined depending on the silicon carbide film forming conditions including reaction temperature, reaction pressure, source gas feed rate and quantity. The speed at which the gas feed and discharge conduits 12 and 17 are moved may also be properly determined depending on the silicon carbide film forming conditions.

With the silicon carbide film forming apparatus of the above-illustrated arrangement, the distal end of the gas feed conduit 12 is axially moved through the member 4 while feeding a source gas thereto and in unison therewith, the distal end of the gas discharge conduit 17 is axially moved through the member 4 while taking in unnecessary gases therefrom. Thus ensures that a constant reaction region is always defined and gas phase synthesis and deposition takes place under the same conditions over the entire inner surface of the member 4 from its lower end to its upper end. Then a uniform, homogeneous, dense silicon carbide film deposits on the entire inner surface of the member 4.

When the member 4 is a cylindrical silicon carbide base substrate, there is obtained a quality silicon carbide coated silicon carbide reaction tube for use as a semiconductor diffusion furnace which eliminates inconvenience such as a failure or separation of the coating during heat treatment (or furnace operation) which can cause semiconductor to be contaminated with impurities originating from coating fragments.

The silicon carbide film forming apparatus of the present invention is not limited to the illustrated embodiment and many modifications and alterations may be made thereto. For example, instead of resistance heating, heating means of induction heating, infrared radiation heating, and laser beam heating types may be used. Although the apparatus is of the vertical type in the illustrated embodiment, it may be of the horizontal type wherein the reaction vessel has a horizontal axis. The gas feed and discharge conduits and the drive mechanism as well as the configuration and arrangement of respective parts may be altered within the scope of the invention.

One example of the apparatus is shown below together with its operation.

EXAMPLE

The silicon carbide film forming apparatus was of the arrangement shown in the FIGURE. A silicon carbide tube 4 having an inner diameter of 150 mm, an outer diameter of 160 mm and a length of 2,000 mm was mounted within the reaction vessel 3. The cover 8 was attached to the vessel 3 for air-tight closure of the upper end thereof. The reaction vessel 3 was purged and kept vacuum through the discharge conduit 17 by means of a vacuum pump. Electricity was conducted across the heater 5 for resistance heating the vessel interior to heat the silicon carbide tube 4 at 1300° C. A source gas containing 5,000 SCCM(standard cubic centimeter per minute) of hydrogen gas and 50 SCCM of methyltrichlorosilane was injected into the silicon carbide tube 4 interior through the feed conduit 12. At the same time, the motor 19 was actuated so as to slowly move axially upward the gas feed and discharge conduits 12 and 17 in unison through the silicon carbide tube 4 at a speed of 200 mm/hr. In this way, silicon carbide was gas phase deposited over the entire inner surface of the silicon carbide tube 4 from its lower end to its upper end. There was obtained a silicon carbide base reaction tube coated with dense silicon carbide over the inner surface.

In this tube, the silicon carbide film had an average thickness of 150 μm with a variation of 5 μm everywhere at the opposite ends and the center. Microscopic observation on the cross sections of the silicon carbide tube at the opposite ends and the center proved that the silicon carbide film was uniform and homogeneous because a laminar structure was found nowhere.

There has been described a silicon carbide film forming apparatus which can form a uniform, homogeneous, dense silicon carbide film over the entire inner surface of a long cylindrical member. When the member is a silicon carbide base tube, there is obtained a quality silicon carbide coated silicon carbide reaction tube intended for use as a semiconductor diffusion furnace which eliminates inconvenience such as a failure or separation of the coating during furnace operation or heat treatment which can cause semiconductor to be contaminated with impurities originating from coating fragments.

We claim:

1. An apparatus for forming a high purity silicon carbide film on the inner surface of a cylindrical member by a chemical vapor phase deposition process, said apparatus comprising
    a reaction vessel for receiving the member to be coated,
    a heating means for heating the member in the reaction vessel,
    a gas feed conduit having a distal end disposed for axial motion within the member, for feeding a source gas containing a carbon source and a silicon source into the interior of the member,
    a gas discharge conduit having a distal end disposed for axial motion within the member, for discharging used reaction gases from within the member, and
    means for moving the gas feed and discharge conduits in unison.

* * * * *